US010475667B2

(12) United States Patent
Tani et al.

(10) Patent No.: US 10,475,667 B2
(45) Date of Patent: Nov. 12, 2019

(54) SEMICONDUCTOR MODULE AND CONDUCTIVE MEMBER FOR SEMICONDUCTOR MODULE INCLUDING CUT IN BENT PORTION

(71) Applicant: Mitsubishi Electric Corporation, Tokyo (JP)

(72) Inventors: Masakazu Tani, Tokyo (JP); Yoshiyuki Deguchi, Tokyo (JP); Kazuki Sakata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/518,353

(22) PCT Filed: Nov. 6, 2014

(86) PCT No.: PCT/JP2014/079418
§ 371 (c)(1),
(2) Date: Apr. 11, 2017

(87) PCT Pub. No.: WO2016/071982
PCT Pub. Date: May 12, 2016

(65) Prior Publication Data
US 2017/0309498 A1 Oct. 26, 2017

(51) Int. Cl.
*H01L 21/48* (2006.01)
*H01L 23/48* (2006.01)
(Continued)

(52) U.S. Cl.
CPC ...... *H01L 21/486* (2013.01); *H01L 21/76898* (2013.01); *H01L 23/48* (2013.01);
(Continued)

(58) Field of Classification Search
CPC ............... H01L 24/28–33; H01L 24/83; H01L 23/48–50
See application file for complete search history.

(56) References Cited

U.S. PATENT DOCUMENTS

| 8,680,658 B2 * | 3/2014 | Shi ................... H01L 23/49551 257/673 |
| 2005/0093137 A1 * | 5/2005 | Ishikawa ............... H01L 25/072 257/712 |

(Continued)

FOREIGN PATENT DOCUMENTS

| CN | 1848425 A | 10/2006 |
| EP | 1713124 A2 | 10/2006 |

(Continued)

OTHER PUBLICATIONS

English Translation of JP2002-43508A Provided by AIPN, Feb. 8, 2002.*

(Continued)

*Primary Examiner* — Stephen M Bradley
(74) *Attorney, Agent, or Firm* — Sughrue Mion, PLLC; Richard C. Turner

(57) ABSTRACT

A semiconductor module is provided with a conductive member having one end, in a longitudinal direction, joined to an electrode of a semiconductor element that is mounted on an insulating substrate, the other end of the conductive member in the longitudinal direction being joined to a component different from the electrode. The conductive member is made up of a metal sheet, and has a bent portion at the one end and at the other end. The bent portion provided at the one end has a cut in a leading end portion, in the longitudinal direction, and an end joining section at which the cut is not present is joined to the electrode of the semiconductor element. As a result, a semiconductor module (Continued)

can be realized that allows combination of increased current capacity with improved reliability.

13 Claims, 2 Drawing Sheets

(51) Int. Cl.
H01L 25/07 (2006.01)
H01L 25/18 (2006.01)
H01L 21/768 (2006.01)
H01L 23/498 (2006.01)
H01L 23/00 (2006.01)

(52) U.S. Cl.
CPC .. *H01L 23/49811* (2013.01); *H01L 23/49827* (2013.01); *H01L 24/37* (2013.01); *H01L 24/40* (2013.01); *H01L 24/41* (2013.01); *H01L 24/84* (2013.01); *H01L 25/07* (2013.01); *H01L 25/072* (2013.01); *H01L 25/18* (2013.01); *H01L 2224/37011* (2013.01); *H01L 2224/37124* (2013.01); *H01L 2224/37147* (2013.01); *H01L 2224/40227* (2013.01); *H01L 2224/40245* (2013.01); *H01L 2224/40499* (2013.01); *H01L 2224/4103* (2013.01); *H01L 2224/41051* (2013.01); *H01L 2224/41052* (2013.01); *H01L 2224/41111* (2013.01); *H01L 2224/41174* (2013.01); *H01L 2224/73263* (2013.01); *H01L 2224/848* (2013.01); *H01L 2224/8484* (2013.01); *H01L 2224/8485* (2013.01); *H01L 2224/8492* (2013.01); *H01L 2224/84205* (2013.01); *H01L 2224/84801* (2013.01); *H01L 2224/92246* (2013.01); *H01L 2924/0002* (2013.01)

(56) References Cited

U.S. PATENT DOCUMENTS

| | | | | |
|---|---|---|---|---|
| 2007/0235860 | A1* | 10/2007 | Steger | H01L 23/492 257/706 |
| 2013/0105985 | A1 | 5/2013 | Tsuruoka et al. | |
| 2013/0307156 | A1* | 11/2013 | Bayerer | H01L 24/24 257/762 |
| 2015/0061098 | A1* | 3/2015 | Imoto | H01L 23/24 257/676 |

FOREIGN PATENT DOCUMENTS

| | | | | |
|---|---|---|---|---|
| JP | 44-007544 Y1 | 3/1969 | | |
| JP | 01-218092 A | 8/1989 | | |
| JP | 09172136 A | 6/1997 | | |
| JP | 2002043508 A | * 2/2002 | ............ | H01L 24/46 |
| JP | 2005-005593 A | 1/2005 | | |
| JP | 2005-183568 A | 7/2005 | | |
| JP | 2006-344841 A | 12/2006 | | |
| JP | 2013094824 A | 5/2013 | | |

OTHER PUBLICATIONS

International Search Report of PCT/JP2014/079418, dated Dec. 22, 2014. [PCT/ISA/210].
Japanese Office Action; Application No. 2016-557392; dated Aug. 22, 2017.
Japanese Office Action; dated Dec. 12, 2017; Application No. 2016-557392.
Communication dated Jun. 6, 2018, from the European Patent Office in counterpart European Application No. 14905388.6.
Communication dated Nov. 2, 2018, from State Intellectual Property Office of the P.R.C. in counterpart application No. 201480082980.2.

* cited by examiner

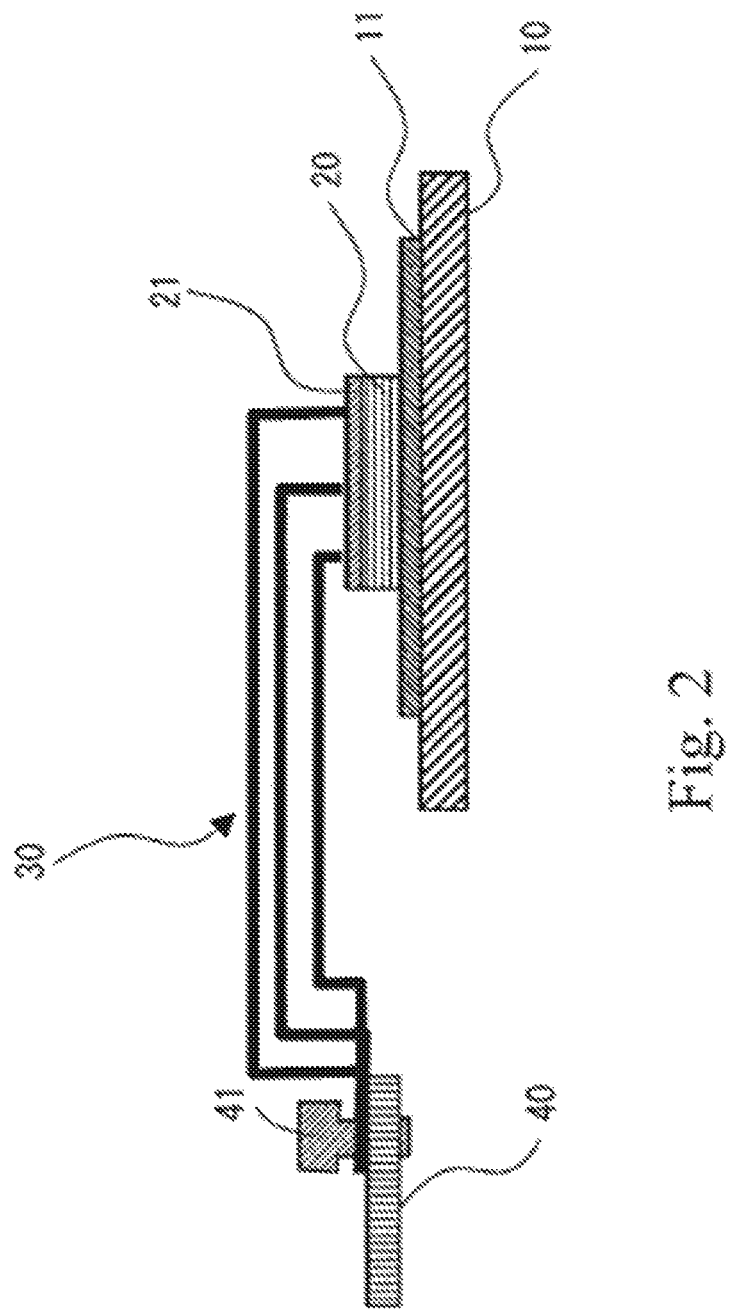

SEMICONDUCTOR MODULE AND CONDUCTIVE MEMBER FOR SEMICONDUCTOR MODULE INCLUDING CUT IN BENT PORTION

CROSS REFERENCE TO RELATED APPLICATIONS

This application is a National Stage of International Application No. PCT/JP2014/079418 filed Nov. 6, 2014, the contents of all of which are incorporated herein by reference in their entirety.

TECHNICAL FIELD

The present invention relates to a semiconductor module for achieving both increases in current capacity and improved reliability, and to a conductive member for a semiconductor module.

BACKGROUND ART

Semiconductor modules for switching control of current and made up of IGBTs or MOS-FETs are main components of power conversion devices such as inverters and chargers. Power conversion devices are required to deliver ever higher output to match the ongoing progress in electric-powered vehicles, and current capacity of semiconductor modules shows a trend towards an increase.

Concomitantly with the evolution of semiconductor elements of SiC or the like, such elements can now operate in high-temperature environments at around 200° C., and structural reliability in thermal cycling has become much stricter than it was conventionally. Semiconductor modules are therefore required to afford increased current capacity from higher output, while also securing reliability in terms of being capable of operating normally over long periods of time in a high-temperature environment.

In order to increase current capacity it is essential to reduce the electric resistance value of a current-carrying member. In order to secure reliability in environments from low temperature to high temperature, moreover it is essential to reduce cold thermal stress at joints of constituent members inside a semiconductor module, and to reduce residual stress at these joints.

Conventional semiconductor modules include instances where a conductive member is directly joined to an electrode of a semiconductor element, in order to increase current capacity (for instance, PTL 1).

CITATION LIST

Patent Literature

[PTL 1] Japanese Patent Application Publication No. 2005-5593

SUMMARY OF INVENTION

Technical Problem

Conventional technologies however have the following problems.

The conventional semiconductor module disclosed in PTL 1 uses a copper material in accordance with current capacity. However, both cross-sectional area and rigidity often increase when such a copper material is used for increased output.

Further, the wiring structure of PTL 1 exhibits a large difference in thermal expansion between the electrode of the semiconductor element and the conductive member. Strain arises at joint surfaces, and cold thermal stress occurs as a result. This gives rise to the problem of peeling and cracks at joint surfaces between the electrode of the semiconductor element and the conductive member.

Further, the dimensional tolerance of the constituent members of the semiconductor module fails to be absorbed, and residual stress occurs at the joint surface of the electrode of the semiconductor element and the conductive member. This residual stress is a cause of peeling and cracks described above, and gives rise to problems relating to reliability.

The electric resistance value of high-frequency components in the conventional semiconductor module disclosed in PTL 1 is large, and the module is thus limited in terms of affording increased current capacity.

It is an object of the present invention, arrived at in order to solve the above problems, to achieve a semiconductor module and a conductive member for a semiconductor module that allow combination of increased current capacity with improved reliability.

Solution to Problem

The semiconductor module according to the present invention is a semiconductor module provided with a conductive member having one end, in a longitudinal direction, joined to an electrode of a semiconductor element that is mounted on an insulating substrate, the other end of the conductive member in the longitudinal direction being joined to a component different from the electrode, wherein the conductive member is made up of a metal sheet, and has a bent portion at the one end and at the other end; and the bent portion provided at the one end has a cut in a leading end portion in the longitudinal direction and an end joining section at which the cut is not present is joined to the electrode of the semiconductor element.

The conductive member for a semiconductor module according to the present invention is a conductive member that is used in a semiconductor module, the conductive member having one end, in a longitudinal direction, joined to an electrode of a semiconductor element that is mounted on an insulating substrate inside the semiconductor module, the other end of the conductive member in the longitudinal direction being joined to a component different from the electrode, wherein the conductive member is made up of a metal sheet; and has a bent portion at the one end and at the other end; and the bent portion provided at the one end has a cut in a leading end portion in the longitudinal direction and an end joining section at which the cut is not present is joined to the electrode of the semiconductor element.

Advantageous Effects of Invention

In the present invention, a semiconductor module is configured by using a conductive member having bent portions, at both ends in the longitudinal direction, as a wiring material that is directly connected to an electrode of a semiconductor element, and in which cuts are formed in the bent portions joined to the electrode. As a result it becomes possible to achieve a semiconductor module and a conductive member for a semiconductor module that allow combination of increased current capacity with improved reliability.

BRIEF DESCRIPTION OF DRAWINGS

FIG. 2 is a cross-sectional diagram of a semiconductor module of Embodiment 2 of the present invention.

DESCRIPTION OF EMBODIMENTS

Figure 1:
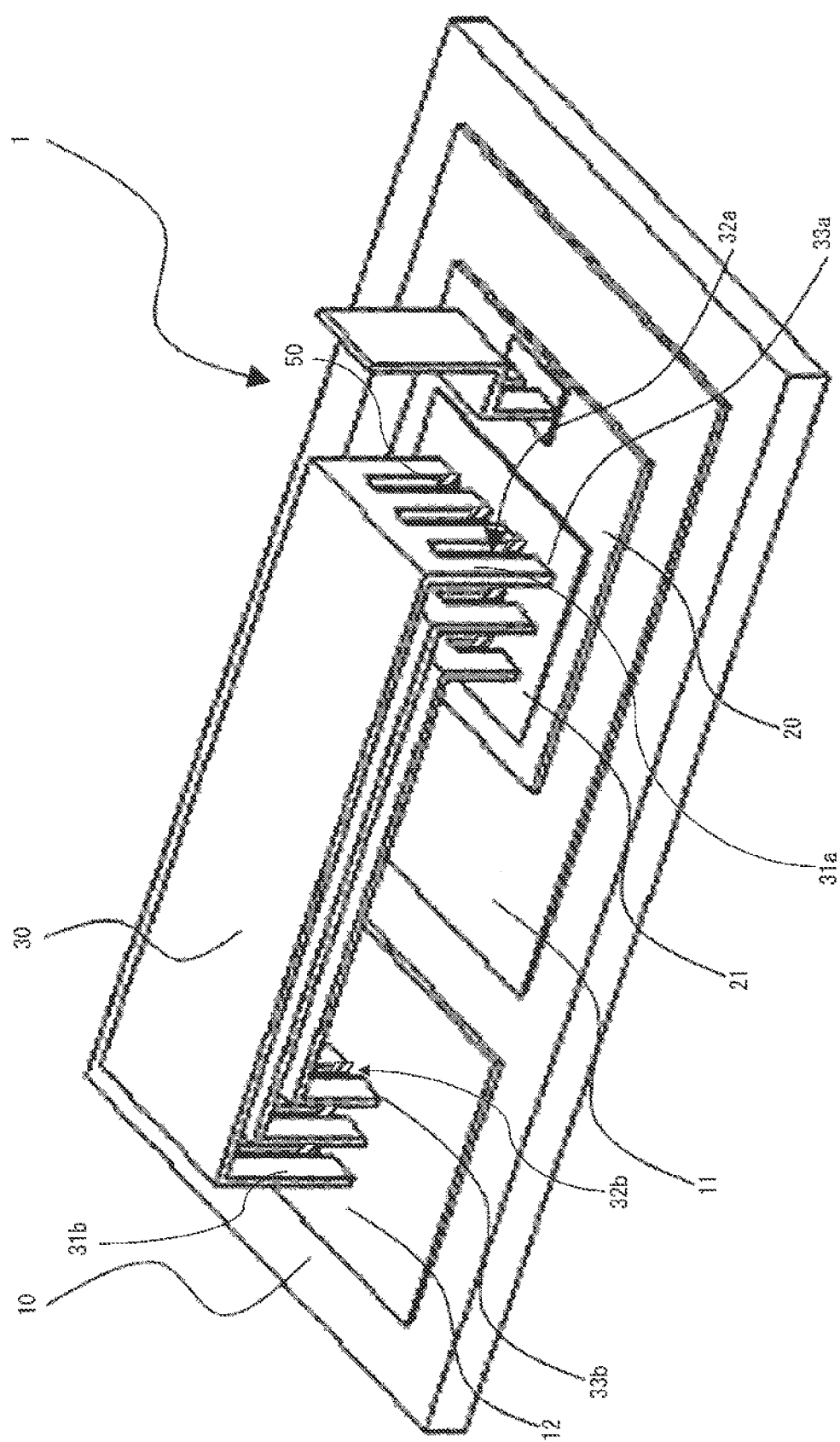
FIG. 1 is a perspective-view diagram of a semiconductor module of Embodiment 1 of the present invention.

Embodiments of the semiconductor module and of the conductive member for a semiconductor module of the present invention will be explained next with reference to accompanying drawings.

Embodiment 1

FIG. 1 is a perspective-view diagram of a semiconductor module of Embodiment 1 of the present invention. The semiconductor module 1 of the present Embodiment 1 is configured by being provided with an insulating substrate 10, a semiconductor element 20 disposed on an electrode 11 of the insulating substrate 10, and a conductive member 30 connected to a terminal 12 disposed on the insulating substrate 10 and to an electrode 21 of the semiconductor element 20.

The conductive member 30 is made up of sheet metal having high conductivity, for instance copper or aluminum. FIG. 1 illustrates an instance where there are used three conductive members 30. The current capacity of electrical wiring sections can be increased by increasing the number of conductive members 30. Accordingly, the number of conductive members 30 can be set, as appropriate, depending on the current capacity.

Both increased current capacity and improved reliability can be achieved even if there is provided one conductive member 30 alone. However, it is preferable to use at least two conductive members 30 or more to configure a main circuit of large current value.

The joining method may be, as a matter of course, ultrasonic joining, solder joining, metal-particle sintering joining and conductive-adhesive joining, but other joining methods may be resorted to without any problem.

For instance a thin copper plate having a thickness of about 0.64 mm is used in the present Embodiment 1 as the conductive member 30 that is utilized to configure the main circuit. As illustrated in FIG. 1, bent portions 31*a*, 31*b* are provided at two sites of the tips, in the longitudinal direction, of the conductive member 30 made up of a copper plate.

Cuts 32*a*, 32*b* are formed, in the longitudinal direction, at the leading end portions of the bent portions 31*a*, 31*b*, respectively. The leading end of the bent portion 31*a* in which the cuts 32*a* are formed is joined to the electrode 21 of the semiconductor element 20. The leading end of the bent portion 31*b* in which the cuts 32*b* are formed is joined to the terminal 12 that is disposed on the insulating substrate 10.

The conductive member 30 is made up of thin sheet metal, and accordingly has low rigidity; further, the conductive member 30 has the cuts 32*a*, 32*b* formed in the longitudinal direction, and therefore has flexibility. As a result, the conductive member 30 of the present Embodiment 1 can deform so as to accommodate the thermal expansion of the insulating substrate 10.

The surface area of the joint of the electrode 21 of the semiconductor element 20 and the conductive member 30 is smaller than that of a conventional structure having no cuts. Strain at the joint is accordingly small. As a result it becomes possible to curtail strain at a joint surface 33*a* of the conductive member 30 and the electrode 21 of the semiconductor element 20, and to suppress the occurrence of cold thermal stress. A similar effect can be elicited through the presence of the cuts 32*b* also in a joint surface 33*b* of the terminal 12 disposed on the insulating substrate 10 and the conductive member 30.

Prototypes of the conductive member 30 having cuts 32*a*, 32*b* of various shapes formed therein were tried, and the obtained data were gathered. As a result it was found that a desirable effect of reducing strain was elicited by providing the cuts 32*a*, 32*b* at the ends of the conductive member 30 in such a manner that the diagonal length of joints having a rectangular shape was 10 mm or less.

When solder-joining the leading end of the bent portion 31*a* of the conductive member 30 and the electrode 21 of the semiconductor element 20, flexibility is lost and reliability impaired when the cuts 32*a* at the tip become filled with solder. Therefore, a resist 50 is applied onto the portion exposed through formation of the cuts 32*a*, to prevent filling of the cuts 32*a* with solder. Flexibility can be secured as a result. An effect similar to that of the cuts 32*a* can be elicited in the cuts 32*b* as well, through coating of the latter with a resist 50.

Also in a case where there is a level difference, in the height direction, between the electrode 21 of the semiconductor element 20 and the terminal 12 disposed on the insulating substrate 10, as illustrated in FIG. 1, the dimensional tolerance of the level difference can be absorbed by virtue of the fact that the conductive member 30 has flexibility. It becomes possible as a result to eliminate residual stress at the joint surface 33*a* and the joint surface 33*b*.

In a case where the cuts 32*a*, 32*b* are provided over an extent such that the height thereof (length in the longitudinal direction) does not exceed the height of the bent portions 31*a*, 31*b* as illustrated in FIG. 1, the joint surfaces 33*a*, 33*b* have flexibility in the in-plane direction, and exhibit improved reliability against thermal stress.

Although not illustrated in the figures, in a case where the cuts 32*a*, 32*b* are provided over an extent such that the height thereof exceeds the height of the bent portions 31*a*, 31*b*, flexibility is enhanced of not only in the in-plane direction, but also in the vertical direction. The dimensional tolerance of the level difference is absorbed as a result, and there is achieved an effect of increasing reliability against residual stress.

Further, high frequency current flows close to the surface of the conductive member 30 on account of the skin effect. Accordingly, the electric resistance of the high frequency component tends to be high. By configuring the conductive member 30 out of thin sheet metal, by contrast, the surface area of the conductive member 30 of the present Embodiment 1 is made larger than that of a conventional conductive member. As a result, the electric resistance of the high frequency component is reduced and the temperature at the joint surfaces 33*a*, 33*b* drops, all of which contributes accordingly to increasing reliability.

In Embodiment 1, thus, a metal sheet of high conductivity is bent, and a resulting conductive member having cuts formed at the bent leading end portions is connected to an electrode of a semiconductor element. The following effects can be elicited as a result.

(Effect 1) Increase in Current Capacity

Current capacity can be increased by using a metal sheet of high conductivity as the conductive member. Further increases in current capacity can be achieved by increasing the number of conductive members, as needed.

(Effect 2) Enhanced Reliability

Using sheet metal as the conductive member allows lowering the rigidity of the conductive member while maintaining flexibility. Further, the joining surface area with the electrode portion of the semiconductor element can be reduced through formation of cuts. As a result there is reduced strain at the joint of the conductive member and the electrode of the semiconductor element, caused by linear expansion differences, and reliability against thermal stress is increased. It becomes also possible to reduce residual stress derived from the dimensional tolerances of the semiconductor module. Further, using sheet metal as the conductive member allows increasing the surface area and suppressing the skin effect through a reduction in electric resistance for a high frequency component. Increases in temperature can be suppressed as a result, which contributes to improving reliability.

Therefore, Embodiment 1 allows providing a flexible conductive member of greater surface area but smaller contact area at joints. Further, Embodiment 1 allows increasing current capacity at electrical wiring sections, preventing peeling at joints caused by cold thermal stress, and improving the reliability of the semiconductor module.

Embodiment 2

In Embodiment 1 an instance has been explained in which the conductive member 30 according to the present invention, having one end connected to the semiconductor element 20, has the other end connected to the terminal 12 disposed on the insulating substrate 10, within a same semiconductor module. In the present Embodiment 2, by contrast, a terminal structure will be explained in which the conductive member 30 according to the present invention, having one end connected to the semiconductor element 20, has the other end connected to an electronic component that makes up another circuit.

FIG. 2 is a cross-sectional diagram of a semiconductor module in Embodiment 2 of the present invention. A comparison with the configuration of Embodiment 1 in FIG. 1 reveals that in the structure of FIG. 2 the terminal structure of the other end of the conductive member 30 differs from that of Embodiment 1 since now the other end of the conductive member 30 is connected to an external electronic component. The explanation below will focus on this different structure.

As illustrated in FIG. 2, the conductive member 30 of the present Embodiment 2 has a structure wherein the conductive member 30 is connected, using a screw 41, to an external conductive member 40 wired from an electronic component that makes up another circuit. The dimensional variability of the external conductive member 40 can be absorbed by adopting such a structure. As a result, a semiconductor module provided with the conductive member 30 according to the present invention can be used for connection to another electronic component, and the reliability of the joint with the other electronic component can be increased.

The invention claimed is:

1. A semiconductor module provided with a conductive member having one end, in a longitudinal direction, joined to an electrode of a semiconductor element that is mounted on an insulating substrate, the other end of the conductive member in the longitudinal direction being joined to a component different from the electrode, wherein the conductive member
is made up of a metal sheet; and
has a straight portion connecting a bent portion at the one end and at the other end in a first direction; and
a leading end portion provided at the one end has a cut, in the longitudinal direction, such that an end joining section at which the cut is not present is joined to the electrode of the semiconductor element without extending beyond an edge of the straight portion in the first direction, wherein the conductive member is made up of two or more separate members individually joined to the electrode of the semiconductor element without being joined to each other at the leading end portion, wherein a resist is applied onto a portion, of the conductive member, exposed by the cut at a tip of the cut that is formed in the bent portion at the one end.

2. The semiconductor module of claim 1,
wherein the other end of the conductive member is connected to an external conductive member wired from an electronic component that makes up another circuit.

3. The semiconductor module of claim 1,
wherein the cut formed in the conductive member is provided over an extent such that the length of the cut in the longitudinal direction does not exceed the length, in the longitudinal direction, of the bent portion provided at the one end.

4. The semiconductor module of claim 1,
wherein the conductive member is configured in the form of sheet metal of copper or aluminum.

5. The semiconductor module of claim 1,
wherein the conductive member is joined to the electrode of the semiconductor element by any one of solder joining, metal-particle sintering joining, conductive-adhesive joining and ultrasonic joining.

6. The semiconductor module of claim 1,
wherein the one end of the conductive member is opposite to the other end of the conductive member.

7. The semiconductor module of claim 1,
wherein the end joining section has a rectangular shape, and
wherein the cut is provided in the conductive member in such a manner that the diagonal length of the end joining section having the rectangular shape is 10 mm or less.

8. The semiconductor module of claim 7,
wherein the other end of the conductive member is connected to an external conductive member wired from an electronic component that makes up another circuit.

9. The semiconductor module of claim 7,
wherein the cut formed in the conductive member is provided over an extent such that the length of the cut in the longitudinal direction does not exceed the length, in the longitudinal direction, of the bent portion provided at the one end.

10. The semiconductor module of claim 7,
wherein the conductive member is configured in the form of sheet metal of copper or aluminum.

11. The semiconductor module of claim 7,
wherein the conductive member is joined to the electrode of the semiconductor element by any one of solder joining, metal-particle sintering joining, conductive-adhesive joining and ultrasonic joining.

12. A conductive member for a semiconductor module, being a conductive member that is used in a semiconductor module, the conductive member having one end, in a longitudinal direction, joined to an electrode of a semiconductor element that is mounted on an insulating substrate, inside the semiconductor module, the other end of the conductive member in the longitudinal direction being joined to a component different from the electrode, wherein the conductive member is made up of a metal sheet; and
has a straight portion connecting a bent portion at the one end and at the other end in a first direction; and
a leading end portion provided at the one end has a cut in the longitudinal direction and an end joining section at which the cut is not present is joined to the electrode of the semiconductor element without extending beyond an edge of the straight portion in the first direction,
wherein the conductive member is made up of two or more separate members individually joined to the electrode of the semiconductor element without being joined to each other at the leading end portion,
wherein a resist is applied onto a portion, of the conductive member, exposed by the cut at a tip of the cut that is formed in the bent portion at the one end.

13. The conductive member of claim 12,
wherein the one end of the conductive member is opposite to the other end of the conductive member.

* * * * *